United States Patent [19]

Züst

[11] 4,057,661
[45] Nov. 8, 1977

[54] METHOD OF MANUFACTURING A THIN-FILM ELECTRODE

[75] Inventor: Harry Züst, Erlenbach, Switzerland

[73] Assignee: Contraves AG, Zurich, Switzerland

[21] Appl. No.: 700,453

[22] Filed: June 28, 1976

Related U.S. Application Data

[62] Division of Ser. No. 577,723, May 15, 1975, abandoned.

[30] Foreign Application Priority Data

May 30, 1974 Switzerland ......................... 7378/74

[51] Int. Cl.² .............................................. C23C 13/02
[52] U.S. Cl. ...................................... 427/125; 33/366; 29/570; 29/573; 204/192 F; 427/124; 427/126; 427/250; 427/255; 427/404
[58] Field of Search ............... 427/124, 125, 126, 250, 427/255, 404; 33/366; 204/192, 290 R; 75/5 A; 29/570, 573

[56] References Cited

U.S. PATENT DOCUMENTS

| | | | |
|---|---|---|---|
| 2,719,097 | 9/1955 | Auwärter | 427/125 |
| 3,218,194 | 11/1965 | Maissel | 427/125 |
| 3,256,588 | 6/1966 | Sikina | 427/124 |
| 3,386,894 | 6/1968 | Steppat | 427/125 |
| 3,443,933 | 5/1969 | Boyhan | 75/108 |
| 3,529,350 | 9/1970 | Rairden | 427/125 |
| 3,616,406 | 10/1971 | Turner | 204/192 |
| 3,711,383 | 6/1973 | Schiekel | 204/29 |
| 3,823,486 | 7/1974 | Bhat | 33/366 |
| 3,873,944 | 3/1975 | Vaguine | 333/1.1 |

OTHER PUBLICATIONS

Chopra, Thin Film Phenomena, McGraw-Hill, (1969) p. 31.
Chance et al, IBM Tech. Disclosure Bull., "Ceramic Metalization", vol., No. 12, p. 1835 (1966).

Primary Examiner—Ralph S. Kendall
Assistant Examiner—John D. Smith
Attorney, Agent, or Firm—Werner W. Kleeman

[57] ABSTRACT

A method of manufacturing a thin-film electrode constituting a multi-layer electrode structure supported at an electrically insulating surface of a supporting element, comprising: a first step of depositing a thin-film layer on said surface and, in succession a second step of depositing an additional thin-film layer on top of the previously deposited thin-film layer, said second depositing step being carried out at least once, and the last one of the depositing steps being carried out in a vacuum chamber under reduced pressure of a residual gas.

3 Claims, 7 Drawing Figures

METHOD OF MANUFACTURING A THIN-FILM ELECTRODE

CROSS-REFERENCE TO RELATED CASE

This application is a divisional application of my commonly assigned, copending U.S. application Ser. No. 577,723, filed May 15, 1975, now abandoned and entitled "Feeler Element for the Electrical Measurement of Inclinations".

BACKGROUND OF THE INVENTION

The present invention concerns a new and improved construction of a level or feeler element for the electrical measurement of inclinations and for the determination of the true vertical in the case of stationary bodies and the apparent vertical in the case of moving bodies, and this invention specifically pertains to a noval method of manufacturing a thin-film electrode for such level or feeler element.

There are known to the art such feeler elements which are constructed in the form of tubular levels for the indication of the inclination in only one direction, and others in the form of box or spherical levels for the indication of the inclination in all directions. It is known that for the fabrication of such feeler elements in combination with electrodes formed of a good conductive material there should be employed an electrolytic solution of good conductivity, for instance, a solution of an alkali halide in an alcohol. This solution is then filled into a container, there remaining a gas bubble, the position of which determines the current flow lines between the electrodes and thus the measured impedance. The change of the impedance between two electrodes is produced as a function of the tilting of the feeler element due to a change in the equilibrium position of the liquid and the gas bubble in the container.

It is also known to the art to embed electrodes in an electrically insulating wall of a container and to form the side of this structure confronting the liquid as a section of a hollow sphere- or ring-shaped surface. At an oppositely situated wall there is oftentimes applied a so-called base electrode, and the walls equipped with the electrodes possess at least one common symmetry plane which, in the normal position, extends vertically. The individual electrode connections or terminals are coupled with the associated electrodes by conductors which are guided through the walls, provided that the electrode, conductor and electrode connection are not formed of a single part which is cemented in the wall and traverses the same.

The requirements regarding the geometric shape and position of the electrodes and the walls are in direct correlation to the desired precision of the inclination measurement and are especially intensified by the trend towards miniaturization of the feeler elements. As the characteristic for the feeler element, that is to say, as the variation of the measured impedance as a function of the tilting, there is strived for a predetermined generally linear function. However, it is difficult to maintain as small as possible the deviation of the characteristic or characteristic line from the linearity as well as the influence Of the temperature, which via the expanison of the liquid effects the dimensions of the gas bubble. Additionally, there are placed upon the structure requirements concerning a tight seal, corrosion resistance, mechanical resistance and so forth. In consideration of all of these demands the mounting and cementing or otherwise bonding of the electrodes in the walls and the grinding of such structure to the desired precise shape is associated with considerable difficulties and expensive fabrication operations, and notwithstanding the taking of all precautions and measures there is still present a high quota of rejects and there must be taken into account an unsatisfactory reliability quota of the product.

It is kown to overcome the difficulties which prevail due to the mounting and cementing of the electrodes in the walls and the grinding of such structure in that, the electrodes are constructed as layers applied in the form of a paste or lacquer, for instance in the form of appropriately applied platinum layers or silver layers. This makes it possible to construct from each and the same layer a respective electrode, an associated electrode connection and a conductor track which interconnects the same, and wherein the conductor tracks are guided from the interior of the container towards the outside to adhesive bonding locations at which the components of the feeler element which are joined together to form the container come into contact. With this solution there is, however, present the disadvantage that with certain applications, for instance for military purposes for leveling a firing weapon, the required geometric precision of the feeler element cannot be reached by far owing to the layer thickness and the roughness of the electrodes applied in the form of the paste or lacquer. This relates to both the precision of the shape of the inner wall of the container at the region of the electrodes as well as to the precision in joining together the container at the bonding locations at the region of the conductor tracks. Furthermore, it is also a drawback that the adherence strength of the applied layers, among other things, during the aforementioned field of use, does not satisfy the prevailing requirements.

SUMMARY OF THE INVENTION

Hence, in consideration of the foregoing, in the commonly assigned copending United States patent application, Ser. No. 526,788, filed Nov. 25,1974, now abandoned, listing as the inventors Pierre Gernet and Harry Zust, the disclosure of which is incorporated herein by reference, the last-mentioned inventor being the inventor of the development of this application, and which application is entitled "Feeler Element For The Electrical Measurement of Inclinations", there are disclosed novel constructions of feeler elements which render possible a considerably more economical fabrication technique and not only fulfill in a satisfactory manner existing requirements, but also improve the accommodation of the feeler elementcharacteristic to the field of application by virtue of a freer selection of the shape of the electrodes.

The feeler element of the aforementioned commonly assigned, copending application and equally the feeler element of the present application relies upon the use of the so-called thin-film technology. Under the expression thin-film or thin-film layer, as such is used, for instance in the fabrication of electronic components, there are understood layers which are formed at a substrate or support, the layer thickness normally being below 5 microns and generally in a range of 0.01 to 1 micron. The techniques which come under consideration for the formation of the thin-films are, for instance, typically vapor deposition, sputtering, galvanization, chemical separation, although it is to be specifically understood that other appropriate techniques used in the state-of-the-art are in no way precluded, such as for instance, anodising for forming insulating thin-films or layers at certain metals. On the other hand, there are eliminated the so-called thick layers or films, which, among other things, are formed by application of paste or lacquer, for instance by means of a screen printing technique, and the thickness of which typically is in the range of 20 microns.

The feeler element of the aforementioned copending application serves for the determination of the vertical by measuring an electrical impedance between surface electrodes, which impedance varies as a function of tilting, and wherein the electrodes are in contact with a liquid contained within a container and are coupled with a respective electrode terminal or connection which can be placed into contact from the outside. Such feeler element has at least one electrode in the form of a thin-film or layer applied to at least one electrically insulating surface of a wall of the container and which wall surface confronts the liquid.

Such electrodes applied as thin-films do not appreciably protrude past the surface of the wall. The increase in height of the electrode surface which is present due to the thickness of the electrode layer essentially has no influence upon the equilibrium position of the liquid and the gas bubble.

By means of the electrodes applied in the form of a thin-film there is attained the advantage that the properties which are required of the raw material and the electrode material are independent of one another, so that the selection of the materials is not limited by virtue of any requirement regarding compatability of such materials.

The material of a wall is advantageously brought to the desired geometric shape prior to the application of the electrodes, in other words, it is only necessary to work homogeneous materials and not, as in the heretofore known constructions, an inhomogenous structure formed of insulating material, electrode material, and cementing material. The mechanical working or processing is correspondingly facilitated and rendered less expensive. It is known to use for the material of a wall an electrically insulating substance to which there are applied the electrodes of the development of the aforementioned application. Mostly there is employed hard glass, for instance available on the market under the trademarks "PYREX" or "DURAN". Due to the novel application of an electrode in the form of a thin-film there is also rendered possible the variant construction wherein a wall is formed of electrically conductive material, for instance of a corrosion resistant metal, such as tantalum or high-grade steel or also silicon.

With this fabrication technique there is applied, according to the invention of such application, to a wall of the feeler element consisting of electrically conductive material at least at its surface confronting the liquid, an electrically insulating material which is applied as a thin-film, to thereby produce a wall having an electrically insulating surface.

The application of such insulating substance is well known in the thin-film technology. There is used, for instance, the sputtering of oxides in a high-frequency field or the oxidative sputtering of suitable oxide forming metals. When there are used tantalum or silicon there can be formed an extremely thin but highly insulating oxide layer be anodising. Also layers of plastic can be applied.

The advantage of such variant is that for the material of the wall there can be selected a substance on the basis of its resistance, its easier or more precise machining properties and similar characteristics without limitations concerning the electrical behavior. The material of the wall initially advantageously has imparted to it the desired geometric shape, and only thereafter is the surface confronting the liquid provided with an insulating layer at which there is applied the required number of electrodes.

By virtue of the application of the electrodes to the electrically insulating surface of the walls of the container as contemplated by the invention of the aforementioned application the form of the electrodes can be optimized for obtaining the desired characteristic.

It is known that the greatest possible slope of a linear characteristic can be reached with a set of electrodes composed of a base electrode and, for each tilting plane which is to be directly detected, a pair of electrodes approximately constructed as circular surfaces. On the one hand, the electrode pair and, on the other hand, the base electrode are symmetric to a common plane of symmetry. With this approximately circular-surface shape of the electrodes there is present the drawback that a temperature-dependent change of the gas bubble dimensions strongly influences the slope of the characteristic.

It is also known to the art to impart to the electrodes a rectangular contour, wherein a respective pair of sides of a rectangle extend parallel to a symmetry plane of the feeler element. Insofar as this contour approximates a narrow strip, the lengthwise direction of which is located in the tilting plane to be detected and the ends of which are relatively widely spaced from the boundary line between the gas bubble, the electrolyte solution and the container, then the characteristic of the feeler element is quite independent of the geometric contour of the strip at the region of such ends. Consequently, there can be imparted in known manner to such ends a random, for instance rounded shape. What is disadvantageous with this solution is that requirements are placed upon the dimensions of the feeler element which are in direct opposition to the requirement for miniaturization: the influence of the gas bubble dimensions and the deviation from the linearity of the characteristic are only then maintained small if the width of the electrode strip is small in contrast to its length and in contrast to the dimensions of the gas bubble.

It was found that a linear characteristic can be obtained with a different particular shape of the electrode surfaces, wherein with such particular shape there can be considerably reduced the influence of the dimensions of the gas bubble upon the slot of the characteristic.

Again according to the invention of such last-mentioned application Ser. No. 526,788, now adandoned, in a feeler element there are associated with one another at least two surface electrodes in known manner in the form of a pair, which electrodes are arranged in mirror-image fashion and symmetrical to a plane which is vertical in the normal position. Further, the outline or contour of an electrode surface is that of the contour of a planar or flat quadrilateral projected perpendicular to the surface of the wall, the corners of the quadrilateral defining a rectangle possessing sides, two of such sides being perpendicular to the plane of symmetry of the quadrilateral, whereas the remaining sides thereof are formed by circular arcs having a concavity confronting the symmetry plane.

Preferably for an electrode pair the contour of the electrodes consists of the projection of two symmetrical quadrilaterals, the circular-arc shaped sides of which are constructed as the same arcs of two similar circles which intersect at the symmetry plane.

With this construction of such novel feeler element the impedances are advantageously detected between the base electrode and a respective electrode of the electrode pair as an element of a bridge which is balanced in the normal position, and the balancing error caused by tilting corresponds to the characteristic of the feeler element. An extensively linear characteristic and an extensively small dependency of the characteristic from the dimensions of the gas bubble can be realized when the gas bubble in the normal position covers approximately one-half of each electrode. The feeler element can be constructed both tubular-shaped with a single electrode pair and a base electrode as well as also spherical- or box-shaped with two electrode pairs and a base electrode. In the first instance mentioned immediately above the feeler element possesses one plane of symmetry and in the second instance two planes of symmetry which are perpendicular to one another, however, it is to be also expressly understood that variations containing three or more electrode pairs and planes of symmetry, while not particularly advantageous, however, are also not intended to be precluded.

With the application of the electrodes in the form of thin-films upon the electrically insulating surface of the walls of the container, it is also possible through the use of other electrode contours to obtain diverse non-linear characteristics, for instance, and depending upon the field of application, square, logarithmic and other characteristics. Owing to the precision of the contour or outline of the eletrodes which can be attained with the thin-film technology there are not only opened up the aforementioned new possibilities, but additionally the reproducibility of the products is considerably facilitated and improved in contrast to the known constructions.

A further advantage of the novel application of the electrodes in the form of thin-films as disclosed in the lastmentioned commonly assigned application Serial No. 526,788, now abandoned, is that for improving their adherence strength and the corrosion resistance, the electrodes can be applied in multiple films or layers in a manner well known in the thin-film art. Practically all of the known combinations of an adherence-improving lower layer and an electrically and chemically advantageous upper layer can be employed: for instance, there is applied to a wall of hard glass a thin-film consisting of a lower layer of nickel-chromium alloy and an upper layer of gold or platinum. There are also known many insulating plastics which do not become damaged by the application of certain thin-films, for instance formed of alumium or gold, so that among other things these metals can be used as the lower layer in order to improve the application of electrodes to plastic-coated walls and to facilitate the use of such surface-insulated walls.

As already mentioned, with the heretofore known constructions of a feeler element, the individual electrode terminals are connected with the corresponding electrodes by conductors or lines which are guided through the walls or at bonding locations, causing difficulties with regard to the fabrication costs, the precision and the reliability of the feeler element, and in many instances practically precluding the use of electrically conductive material for the walls of the container. It has been found that the solution of this problem is also facilitated by the use of the thin-film technology.

Accordingly, an electrode with an associated electrode terminal is electrically coupled in conventional manner by means of a conductor track which likewise is applied as a thin-film in known manner at the electrically insulating surface parts of components of the feeler element joined together into a container.

In this way there is advantageously obtained the result that the conductor tracks, owing to their lesser layer or film thickness can be guided from the interior of the container towards the outside to bonding locations, at which the components of the feeler element which are joined together to form the container come into contact, without the precision of the feeler element being impaired.

It is advantageous, although not absolutetly necessary, that the conductor tracks and the electrodes consist of the same thin-films. Also the conductor tracks can be either freely exposed or in conventional manner covered by an electrically insulating thin-film deposited thereon. In the latter instance the conductor tracks do not come into contact with the liquid and they do not contribute to the electrode surface. In the first instance, when the partial surfaces of the conductor tracks which are in contact with the liquid are small in relation to the surface of the associated electrodes then a covering is not necessary; this particularly favorable constructional modification can be attained with short and narrow conductor tracks.

Through the use of the thin-film technology there is further possible a different novel construction of a feeler element. It is known in the thin-film art, through the application of certain alloys, such as for instance nickel-chromium alloys, to produce layers, at the surface of which, between two random locations, there can be measured a considerably greater electrical resistance than between two similarly situated locations at the surface of a good conductor, for instance a thick copper layer. The same result can be obtained by application of an extremely thin-film or layer of a likewise good electrical conductor. During the production of resistors in the thin-film art there are mostly usefully employed both parameters, the composition of the film and the film thickness.

It has been found that in a feeler element there is advantageously localized a considerably electrical resistance in the electrodes and these electrodes are contacted by a relatively good conductive liquid at a variable proportion or part of their surface, wherein such part is thereby practically short-circuited.

With this manufacturing technique the feeler element of the invention of the aforementioned application is further characterized by the features that in the presence of the liquid the electrical resistance between two locations of an electrode surface is considerably greater than upon contact of such locations with the liquid.

As mentioned in the above-disclosed copending application Ser. No. 526,788, now abandoned as the liquid there can be used mercury, whereby however, in such case certain metals such as gold and silver are then precluded for the construction of the electrodes. With sufficiently great specific surface resistance of the electrodes there can be used as the liquid also a conventional feeler element-liquid, such as for instance an alkali halide in an alcohol. Moreover, a particularly advantageous liquid has been disclosed in the commonly assigned, copending United States application, Ser. No.

534,654, now abandoned filed Dec. 19, 1974, of Harry Zust, the disclosure of which is incorporated herein by reference, and entitled "Liquid For A Feeler Element For The Electrical Measurement Of Inclinations", and the continuation-in-part application Ser. No. 640,879 wherein the liquid contains a major proportion by weight of hydrazine-monohydrate. In particular such liquid advantageously may contain 40 ml hydrazine-monohydrate, 8 ml ethyl alcohol, 0.5 grams potassium iodide and 0.5 ml of a 4% solution of a wetting agent containing fatty alcohol sulfonate in ethanol. However, neither the feeler element of the present application nor that of the aforementioned copending United States application, Ser. No. 526,788, now abandoned, is limited to the use of any particular liquid inasmuch as mentioned above, prior art level liquids of conventional composition can be employed if compatible and if desired, although the aforementioned liquid which constitutes the subject matter of the just-mentioned United States applications, Ser. Nos. 534,654, now abandoned, and 640,879 has been found to be particularly advantageous.

Now with the foregoing background in mind, it is to be appreciated that the present invention constitutes an improvement upon the level or feeler element of Unites States application, Ser. No. 526,788, now abandoned and is manifested by the features that such improved type feeler element has a thin-film electrode structure constituted by a number of layers and the outer side or surface of the multi-layer electrode structure which faces away from the aforementioned wall of the container which confronts the liquid consists of a vapor deposited, electrochemically active black layer.

According to a further aspect of the present invention the electrochemically active black layer consists of a layer which is galvanically treated after the vapor deposition.

The term "qalvanically treated" as used herein means electrochemical treatment which may include galvanic deposition and/or restructuring of the deposited film or layer or a part thereof.

A feeler element equipped with at least one electrode as contemplated by the present invention has, according to a first embodiment, a thin-film electrode structure composed of three superimposed layers. In particular, there is provided a first adhesion or bonding layer of about 0.2 microns thickness and formed of a 50:50 Ni-Cr-alloy, a second protective layer formed of gold and of a thickness up to about 0.06 microns, and a third layer formed of gold black and having a thickness up to about 1.1 microns.

The adhesion layer and the protective layer are vapor deposited under conventional vacuum conditions. The vapor deposittion of the gold black layer occurs in the presence of nitrogen-or helium residual gas in a pressure range of 0.1 to 2 Torr (1 Torr is equal to 1mm Hg pressure) at high vapor deposition speed. Instead of the gold black layer the black layers can consist of other noble metals, such as for instance, platinum, iridium, rhodium, osmium and so forth, or of certain transition elements such as, for instance, antimony, bismuth and so forth as well as alloys thereof.

According to another embodiment the feeler element has at least one thin-film electrode structure formed of four layers. The first layer again is the adhesion layer and consists of a 50:50 Ni-Cr-alloy of approximately 0.2 microns thickness, the second layer is a protective layer formed of gold and having a thickness up to about 0.06 microns, the third layer is a metallic platinum layer formed by vapor deposition or by sputtering, and the last or fourth layer is a galvanically separated platinum black layer having a thickness up to about 1 micron. The metallic platinum layer consistuting the third layer also can be galvanically deposited with a thickness up to about 1 micron. Where applicable the previously mentioned processing conditions can be likewise employed.

In all embodiments of feeler element disclosed herein the total thickness of the thin-film electrodes is considerably below 5 microns.

It has been found that with the electrodes constructed according to the present invention there is realized a better wetting by the liquid of the level or feeler element and also there is attained a reduction of the transition or contact resistance between the electrode and the liquid.

BRIEF DESCRIPTION OF THE DRAWINGS

The invention will be better understood and objects other than those set forth above, will become apparent when consideration is given to the following detailed description thereof. Such description makes reference to the annexed drawings wherein essentially the same reference characters have been used throughout for the same components, and wherein.

DETAILED DESCRIPTION OF THE PREFERRED EMBODIMENTS

Figure 1:
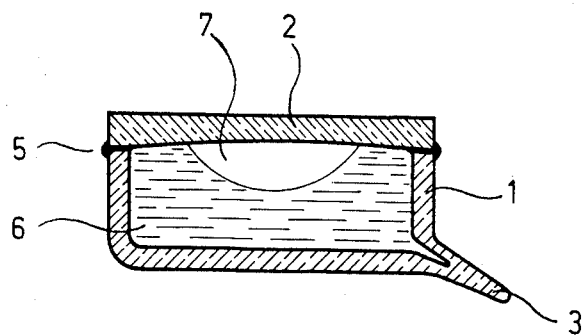
FIG. 1 illustrates an exemplary embodiment of the feeler element in sectional view, the thin-film electrodes, conductor tracks and electrode connection or terminals not being readily visible since they are depicted on an extremely small scale.

In the description to follow Example I relates to FIGS. 1, 2, 3, and 4; Example II especially to FIG. 4; Example III especially to FIG. 5; also Examples IV and V correspond to FIG. 5; and Example VI particularly relates to FIGS. 6 and 7.

EXAMPLE I

According to the showing of FIGS. 1, 2, 3 and 4 a feeler element in the form of a box level consists of a cuvette or vessel 1 and a cover or covering 2 which are assembled and cemented or otherwise bonded together to form the container of the feeler element. In the normal position of the feeler element the cover 2 is above the cuvette or vessel 1 and essentially is horizontally disposed. Both parts are formed of, for example, hard glass, for instance "PYREX". The cuvette or vessel 1 is in the form of an approximately cylindrical hollow body with a floor, the internal diameter of which amounts to 24 mm and the external diameter to 28 mm. At one location of the connection between the cylinder 11 and the floor 12 there is provided a fusible filling stud or connection 3. The floor 12 is approximately 2 mm thick. The upper edge 13 of the cylinder 11 is ground flat. The cover 2 is approximately in the form of a flat cylinder, the upper side 21 of which is flat and the lower side 22 of which in the form of a spherical section of 360 mm radius is ground and polished. Measured at the cylindrical edge 23 the height amounts to 3 mm. The diameter amounts to 28 mm, so that the cuvette or vessel 1 and the cover 2 exactly join or abut one another at the outer diameter.

Figure 2:
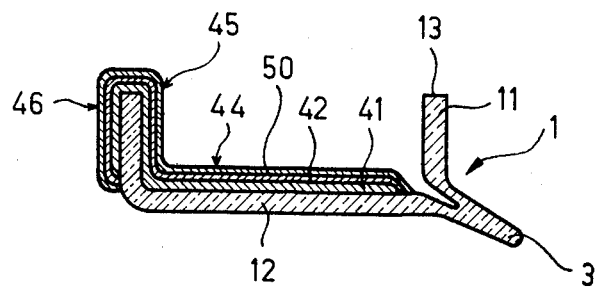
FIG. 2 illustrates a first embodiment of the cuvette or vessel of a feeler element of the type shown in FIG. 1 in sectional view together with the thin-films which have the layer thickness thereof shown on an extremely enlarged or exaggerated scale for improving the illustration.
Figure 3:
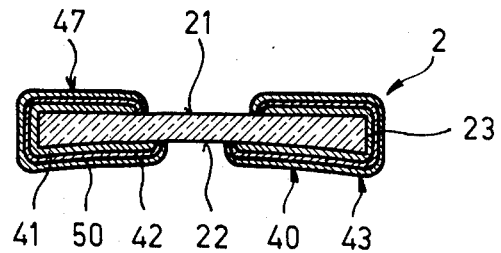
FIG. 3 illustrates a cover or cover member of the feeler element of FIG. 1 in sectional view, again showing the layer thickness of the thin-film on an extremely enlarged or exaggerated scale to improve the illustration.

It is to be appreciated that in the showing of FIG. 1 the thin-film electrodes, conductor tracks and electrode terminals are not visible because the same are assumed to be portrayed on an extremely small scale. This is not the case for the thin-film electrodes shown in FIGS. 2, 3 and 4 wherein each such thin-film electrodes, quite to the contrary, have been illustrated on an exaggerated scale. It is to be recognized that each of the thin-film electrodes 40 provided at the cover 2 in FIGS. 3 and 4 and each thin-film electrode 44 provided at the inside wall surface of floor 12 of the cuvette or vessel 1 as shown in FIG. 2 consist of three films or layers which are applied in superimposed fashion. In particular, each of the thin-film multi-layer electrodes 40 and 44 comprises a lower or first adhesion or bonding layer 41 of about 0.2 microns thickness and formed of a 50:50 Ni-Cr-alloy, a second protective layer or thin-film 42 formed of gold and having a thickness up to about 0.06 microns, and a third layer or thin-film 50 formed of gold black and having a thickness up to about 1.1 microns. The adhesion layer 41 and the protective layer 42 are vapor deposited under conventional vacuum conditions. The vapor deposition of the gold black layer 50 occurs in the presence of nitrogen- or helium residual gas in a pressure range of about 0.1 to 2 Torr at a high vapor deposition speed. Instead of using the gold black layer it would be possible to have the black layer consist of other noble metals, such as for instance, platinum, iridium, rhodium, osmium and so forth, or of certain transition elements such as, for instance antimony, bismuth and so forth as well as alloys thereof.

Further, it is to be appreciated the conductor tracks 43, 45 consist of the same thin-film material and are not covered. The base electrode 44 extends over the entire floor 12 within the cuvette or vessel 1 and a 1 mm wide conductor track 45 leads from such base electrode along an inner jacket line of the cylinder 11, over the edge 13 and along an outer jacket line up to a spot 46 located at approximately one-half of the height of the unit and having a diameter of 5 mm and serving as the electrode connection or terminal. Four circular-shaped electrodes 40 of 7 mm diameter are applied to the lower side 22 of the cover 2, and specifically in a quadrilateral configuration wherein in each case there is a 7 mm spacing from the center of one electrode to the center of the cover. From each electrode 40 there extends radially towards the outside a 1 mm wide conductor track 43 which further extends over the corresponding jacket line of the edge 23 and over the upper side 21 of the cover 2 up to a spot 47 of 5 mm diameter serving as the electrode connection or terminal.

The cuvette or vessel 1 and the cover 2 are cemented to one another by any suitable bonding agent or cement 5, such as the commercially available epoxy resin known in the trade under the mark "ARALDIT". The thus formed container is filled with a 1.5% solution of LiCl in ethanol, or for that matter any other suitable liquid such as those disclosed herein by way of example, and as indicated by reference character 6, there remaining a gas bubble 7 which at room temperature possesses a diameter of about 14 mm. In an optimum bridge circuit at room temperature and with a supply voltage of 1 volt (400 Hz) there is typically attained linear characteristic of 50 mV/mrad± 10%.

EXAMPLE II

Figure 4:
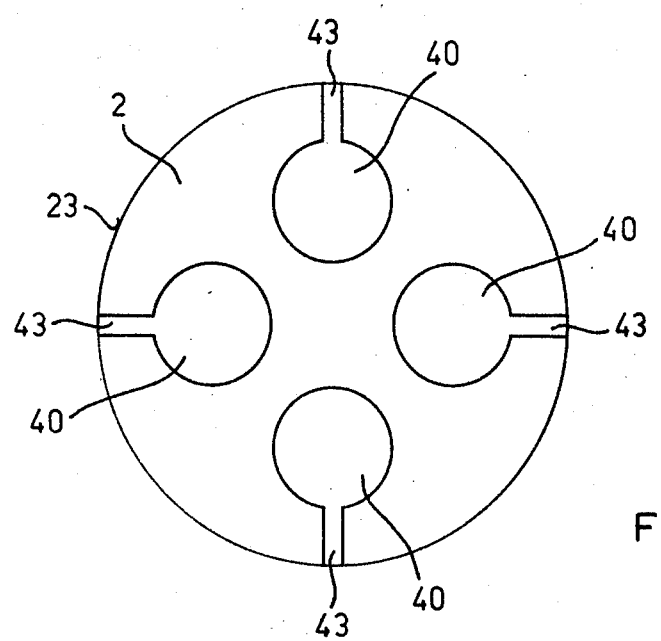
FIG. 4 illustrates a cover of the feeler element of FIG. 1 in plan view according to a first exemplary embodiment of an arrangement of the electrodes thereof.

According to FIG. 4 there is shown a feeler element which merely deviates from the feeler element described in conjunction with Example I in that here the diameter of the four electrodes 40 applied to the cover 2 amounts to 5 mm and the diameter of the gas bubble amounts to approximately 16 mm. There is attained typically a linear characteristic of 140 mV/mrad± 10%.

EXAMPLE III

Figure 5:
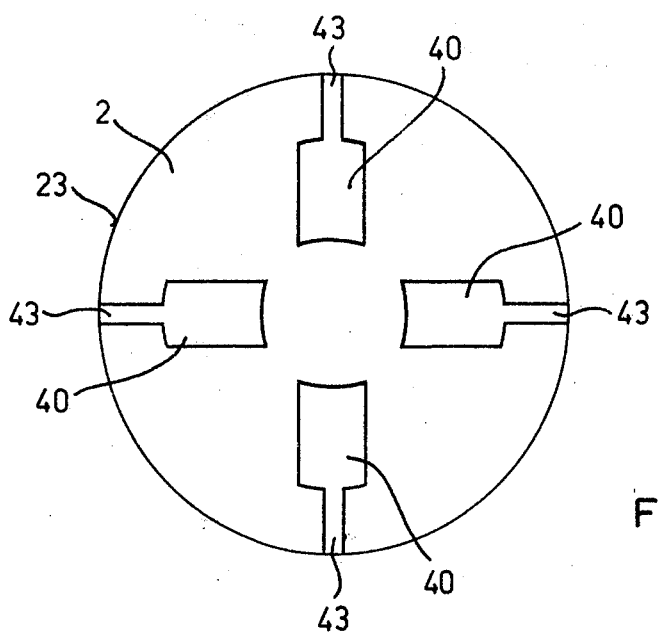
FIG. 5 illustrates a cover of the feeler element according to FIG. 1 in plan view of a second exemplary embodiment of the arrangement of the electrodes thereof.

According to FIG. 5 the feeler element thereof deviates from that shown and described in conjunction with Example I in that there is used a different electrode shape for the four electrodes 40 applied to the cover. These electrodes 40 are derived from the vertical projection of a flat quadrilateral having two straight and parallel sides of 6 mm length at 4 mm spacing from one another and two circular-arc shaped sides of 7 mm radius. The greatest spacing of two oppositely situated electrodes amounts to 8 mm, so that the front circular-arc shaped side of one electrode is located at the same circle as the rear circular arc-shaped side of the oppositely situated electrode. The diameter of the gas bubble amounts to about 14 mm at room temperature. There was again obtained a typical linear characteristic of 60 mV/mrad ± 10%.

EXAMPLE IV

A feeler element deviates from that described in Example III in that other dimensions of the electrodes are used. The length of the straight sides amounts to 4.1 mm, so that the circular-arc shaped sides of the electrodes do not come to lie at the same circles. There was again typically attained a linear characteristic of 160 mV/mrad± 10%.

EXAMPLE V

A feeler element deviates from that described in conjunction with Example IV in that in this case the cover consists of silicon which is covered with a 0.2 micron thick, thermally produced electrically insulating oxide layer. There were obtained the same results as in Example IV.

EXAMPLE VI

Figure 6:
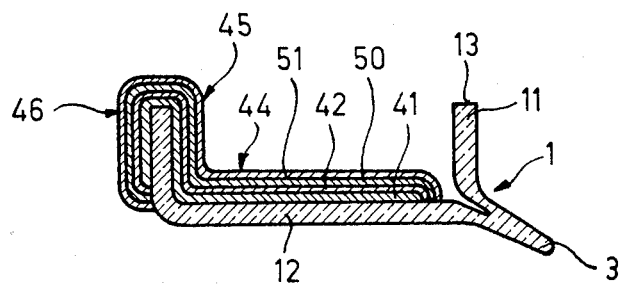
FIG. 6 illustrates a second embodiment of the cuvette or vessel of the feeler element of FIG. 1 in sectional view with the thin-films which have the layer thickness thereof again shown on an extremely enlarged or exaggerated scale for improving the illustration.
Figure 7:
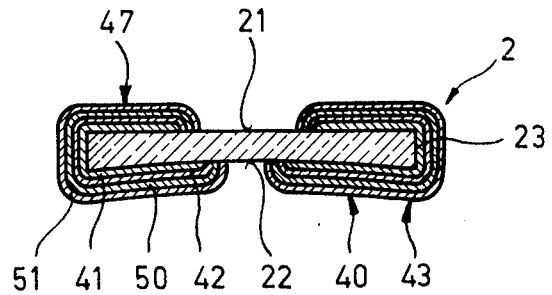
FIG. 7 illustrates another embodiment of the cover of the feeler element of FIG. 6 in sectional view, again showing the layer thickness of the thin-films on an extremely enlarged scale to improve the illustration.

According to this Example which relates to the cuvette of vessel 1 shown in FIG. 6 and its cover as shown in FIG. 7, each such component contains an electrode structure 40 and 44 formed of four layers. The first layer or film 41 again is the adhesion or bonding layer and consists of a 50:50 Ni-Cr-alloy of approximately 0.2 microns thickness and the second layer or film 42 is a protective layer of gold having a thickness up to about 0.06 microns. Both of these layers or thin-films 41 and 42 are formed as explained heretofore with respect to Example I. The third layer 50 is a metallic platinum layer or thin-film formed by vapor deposition or by sputtering and the last layer or thin-film 51 is a galvanically deposited platinum black layer having a thickness up to about 1 micron. The metallic platinum layer 50 also can be galvanically formed with a thickness up to about 1 micron. Again the vapor deposition of the platinum black layer occurs in the presence of nitrogen-or helium residual gas at a pressure range of about 0.1 to 2 Torr with a high vapor deposition speed. Also the black coating instead of being formed of platinum also can consist of other noble metals, such as for instance gold, iridium, rhodium, osmium and so forth or of certain transition elements such as for instance, antimony, bismuth and so forth as well as alloys thereof. In all other respects the feeler element of this embodiment corresponds to the explanations given with respect to Exampl I, it being understood that only the differences therefrom have been here specifically discussed.

In all of the preceding Examples the total thickness of the thin-film electrodes is considerably below 5 microns.

While there are shown and described present preferred embodiments of the invention, it is to be distinctly understood that the invention is not limited thereto, but may be otherwise variously embodied and practiced within the scope of the following claims. Accordingly,

What is claimed is:

1. A method of manufacturing a thin-film electrode consituting a multi-layer electrode structure supported at an electrically insulating surface of a supporting element, comprising the steps of:
   a. depositing a thin-film layer on said surface and, in succession,
   b. depositing an additional thin-film layer on top of the previously deposited thin-film layer,
   c. said second depositing step being carried out at least once,
   d. the last one of the depositing steps comprising vapor depositing an electrochemically active black layer of gold, said vapor deposition being carried out in a vacuum chamber under reduced pressure of a residual gas in a pressure range of 0.1 to 2 Torr.

2. The method as defined in claim 1, wherein the residual gas is nitrogen.

3. The method as defined in claim 1, wherein the residual gas is helium.